(12) United States Patent
Hack et al.

(10) Patent No.: US 9,018,660 B2
(45) Date of Patent: Apr. 28, 2015

(54) LIGHTING DEVICES

(71) Applicant: Universal Display Corporation, Ewing, NJ (US)

(72) Inventors: Michael Hack, Princeton, NJ (US); Huiqing Pang, Newton, PA (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/850,084

(22) Filed: Mar. 25, 2013

(65) Prior Publication Data

US 2014/0284555 A1  Sep. 25, 2014

(51) Int. Cl.
*H01L 29/66* (2006.01)
*H01L 51/52* (2006.01)

(52) U.S. Cl.
CPC ........................... *H01L 51/52* (2013.01)

(58) Field of Classification Search
CPC . H01L 51/52; H01L 51/0545; H01L 51/5203; H01L 51/0072
USPC ......... 257/13, 40, 94, 95, 96, 97, 98, 99, 100, 257/101, 102, 103, 104, E51.017, E51.018, 257/E51.022, E51.026; 438/29, 69, 99
See application file for complete search history.

(56) References Cited

U.S. PATENT DOCUMENTS

| | | |
|---|---|---|
| 4,769,292 A | 9/1988 | Tang |
| 5,247,190 A | 9/1993 | Friend |
| 5,703,436 A | 12/1997 | Forrest |
| 5,707,745 A | 1/1998 | Forrest |
| 5,834,893 A | 11/1998 | Bulovic |
| 5,841,496 A * | 11/1998 | Itoh et al. ..................... 349/113 |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |

(Continued)

FOREIGN PATENT DOCUMENTS

| | | |
|---|---|---|
| WO | 2008057394 | 5/2008 |
| WO | 2010011390 | 1/2010 |
| WO | 2011146734 | 11/2011 |

OTHER PUBLICATIONS

Baldo, et al., "Highly Efficient Phosphorescent Emission fromOrganic Electroluminescent Devices," Nature, Sep. 10, 1998, 4 pp., Macmillan Publishers Ltd., London, UK.

(Continued)

*Primary Examiner* — Cuong Q Nguyen
*Assistant Examiner* — Yosef Gebreyesus
(74) *Attorney, Agent, or Firm* — Morris & Kamlay LLP

(57) ABSTRACT

A device includes a light emitting assembly including at least one light panel including at least one phosphorescent organic light emitting device. A total light emitting area of the light emitting assembly is greater than 1000 $cm^2$. The device exhibits a luminous emittance of at least 7000 $lm/m^2$ and a peak luminance of less than 5000 $cd/m^2$. The light emitting assembly has a luminaire emissive utilization of at least 60 percent.

24 Claims, 7 Drawing Sheets

(56) References Cited

U.S. PATENT DOCUMENTS

| | | |
|---|---|---|
| 6,620,731 B1 | 9/2003 | Farnworth |
| 6,885,157 B1 | 4/2005 | Cok |
| 7,279,704 B2 | 10/2007 | Walters |
| 7,304,634 B2 | 12/2007 | Albert |
| 7,431,968 B1 | 10/2008 | Shtein |
| 7,814,652 B2 | 10/2010 | Bellew |
| 7,968,146 B2 | 6/2011 | Wagner |
| 8,193,528 B2 * | 6/2012 | Schafer et al. ............ 257/40 |
| 2002/0030647 A1 * | 3/2002 | Hack et al. ............ 345/82 |
| 2003/0230980 A1 | 12/2003 | Forrest et al. |
| 2004/0113875 A1 * | 6/2004 | Miller et al. ............ 345/82 |
| 2004/0174116 A1 | 9/2004 | Lu et al. |
| 2006/0052607 A1 * | 3/2006 | Ise et al. ............ 546/2 |
| 2006/0279227 A1 * | 12/2006 | Burghart et al. ............ 315/169.3 |
| 2007/0069638 A1 * | 3/2007 | Matsuura et al. ............ 313/504 |
| 2007/0086180 A1 * | 4/2007 | Sotoyama ............ 362/84 |
| 2008/0293945 A1 * | 11/2008 | Hsieh et al. ............ 546/4 |
| 2009/0050876 A1 * | 2/2009 | Marks et al. ............ 257/24 |
| 2010/0156957 A1 * | 6/2010 | Ogita et al. ............ 345/690 |
| 2011/0222285 A1 * | 9/2011 | Ye et al. ............ 362/249.02 |
| 2011/0284899 A1 * | 11/2011 | Hack et al. ............ 257/98 |
| 2012/0181933 A1 | 7/2012 | Ma et al. |
| 2012/0286298 A1 | 11/2012 | Pang |
| 2012/0286651 A1 | 11/2012 | Levermore et al. |
| 2012/0330386 A1 * | 12/2012 | McNeill ............ 607/90 |
| 2013/0000329 A1 | 1/2013 | Smith |
| 2013/0027857 A1 * | 1/2013 | Jeong ............ 361/679.01 |
| 2013/0241076 A1 | 9/2013 | Mandlik et al. |
| 2013/0264518 A1 * | 10/2013 | Yersin ............ 252/301.16 |
| 2014/0092340 A1 * | 4/2014 | Jeong ............ 349/60 |

OTHER PUBLICATIONS

Baldo, et al., "Very high-efficiency green organic light-emitting devices based on electrophosphorescence," Applied Physics Letters, Jul. 5, 1999, 4 pp., vol. 75, No. 1, American Institute of Physics, Melville, NY, USA.

* cited by examiner

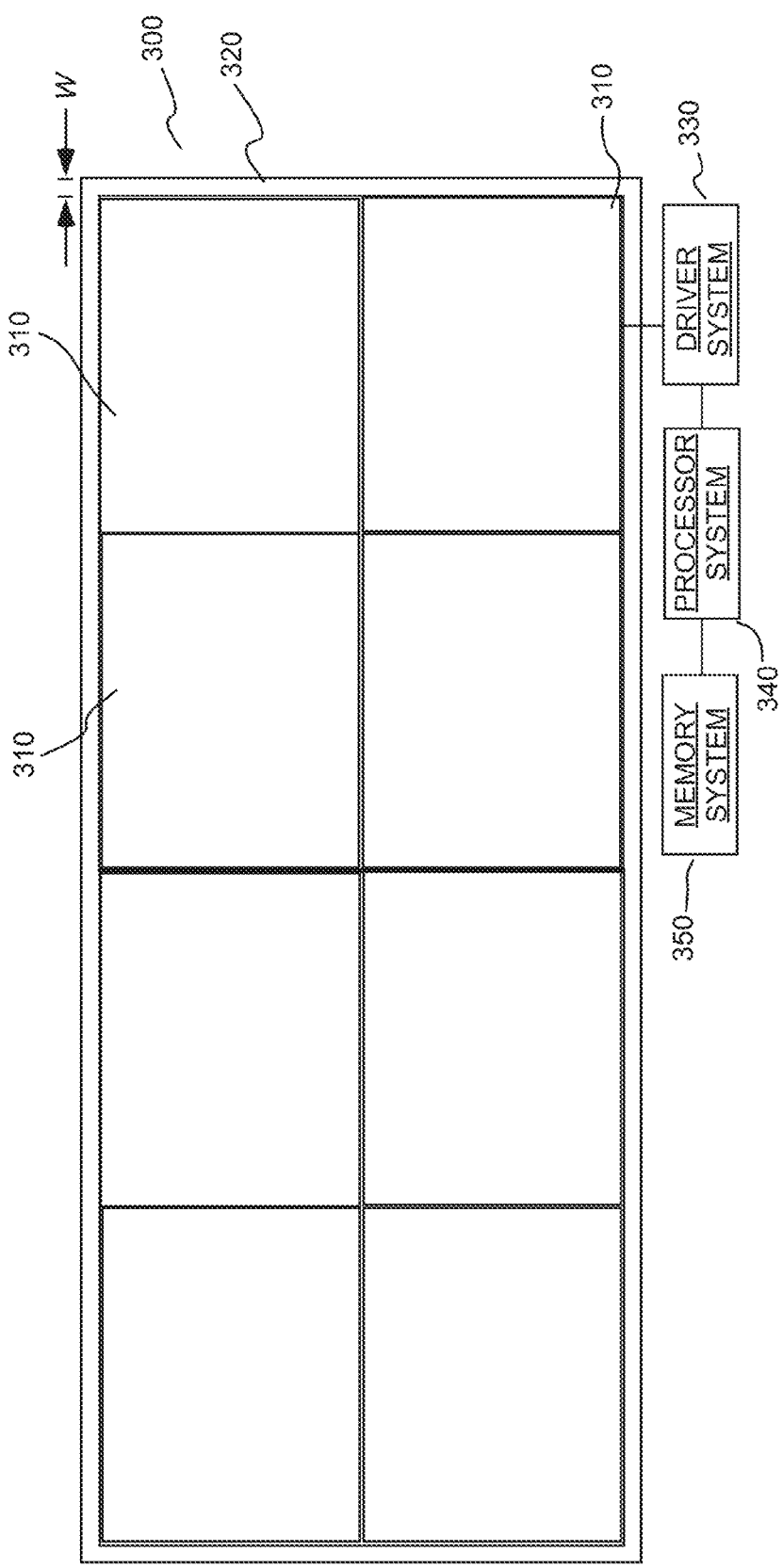

Fig. 7
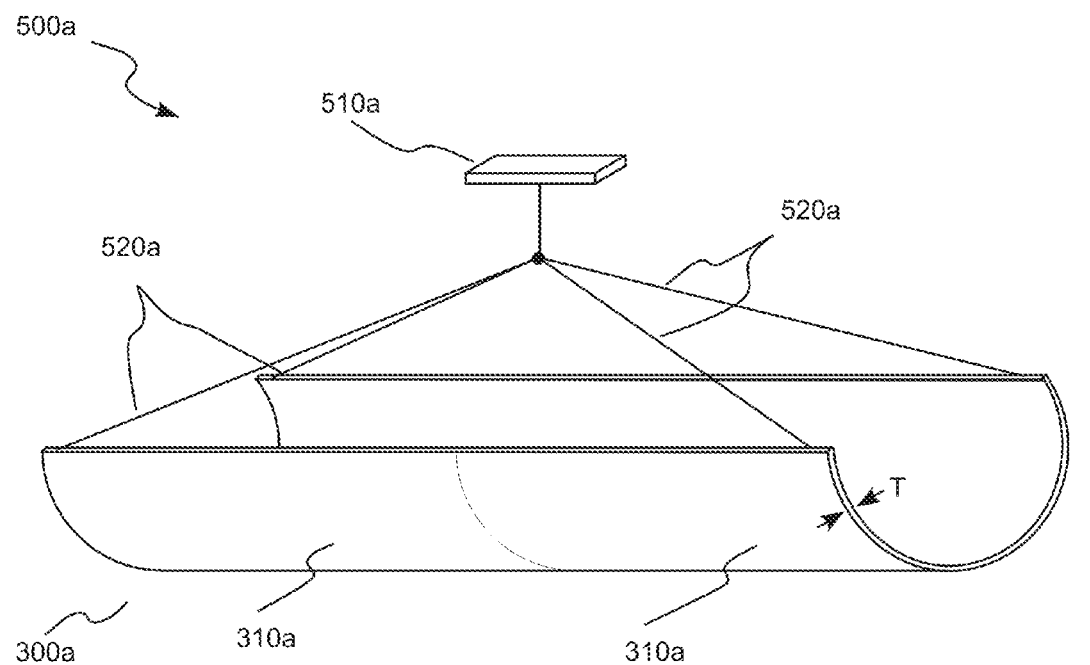
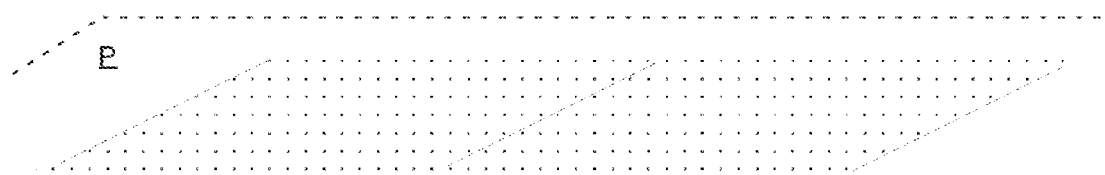

LIGHTING DEVICES

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD

In a number of embodiments, devices, systems and methods hereof relate to light devices including organic light emitting devices.

BACKGROUND

The following information is provided to assist the reader in understanding technologies disclosed below and the environment in which such technologies may typically be used. The terms used herein are not intended to be limited to any particular narrow interpretation unless clearly stated otherwise in this document. References set forth herein may facilitate understanding the technologies or the background thereof. The disclosure of all references cited herein are incorporated by reference.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

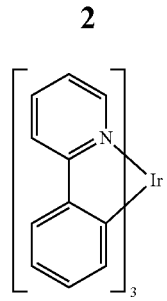

In this structure, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

More details on OLEDs, and the definitions described above, can be found in U.S. Pat. No. 7,279,704, which is incorporated herein by reference in its entirety.

BRIEF SUMMARY

In one aspect, a device includes a light emitting assembly including at least one light panel having at least one phosphorescent organic light emitting device. A total light emitting area of the light emitting assembly is greater than 1000 cm$^2$. The device exhibits a luminous emittance of at least 7000 lm/m$^2$ and a peak luminance of less than 5000 cd/m$^2$. The light emitting assembly has a luminaire emissive utilization of at least 60 percent. In a number of embodiments, light emitted by the at least one light panel includes no greater than 1% light having a peak wavelength less than 440 nm. In a number of embodiments, the device exhibits a luminous emittance of at least 10000 lm/m$^2$ and a peak luminance of less than 5000 cd/m$^2$.

A maximum temperature of the at least one light panel during illumination in ambient conditions may, for example, be no greater than 40° C. or no greater than 35° C. A temperature variance across the area of the at least one light panel may, for example, be no greater than +/−5° C.

In a number of embodiments, the light emitting assembly further includes a bezel encompassing the at least one light panel. The bezel may, for example, have a width no greater than 5 mm, no greater than 3 mm, no greater than 1 mm or even no greater than 0.1 mm.

In a number of embodiment, brightness or dimming of the at least one light panel may be adjustable. The at least one light panel may, for example, include a plurality of phosphorescent organic light emitting devices and a color or a color temperature of the at least one light panel may, for example, be adjustable.

A contrast ratio of the light emitting assembly may, for example, be no greater than 1.6, no greater than 1.3, or no greater than 1.1. The luminaire emissive utilization of the light emitting assembly may, for example, be at least 70%, at least 80% or at least 90%.

The at least one light emitting panel may, for example, be flexible. The at least light emitting panel may, for example, be transparent (in an off state).

In a number of embodiments, the at least one light panel includes a plurality of organic light emitting devices emitting red light, a plurality of organic light emitting devices emitting green light and a plurality of organic light emitting devices emitting blue light, wherein at least the plurality of organic light emitting devices emitting red light and the plurality of organic light emitting devices emitting green light are phosphorescent organic light emitting devices. In a number of embodiments, the plurality of organic light emitting devices emitting blue light include phosphorescent organic light emitting devices.

In another aspect, a method of fabricating a device including a light emitting assembly includes forming at least one light panel having at least one phosphorescent organic light emitting device disposed upon a substrate such that a total light emitting area of the light emitting assembly has an area greater than 1000 cm$^2$, the device exhibiting a luminous emittance of at least 7000 lm/m$^2$ and a peak luminance of less than 5000 cd/m$^2$, and assembling the at least one light panel into the light emitting assembly, wherein a luminaire emissive utilization of the light emitting assembly is at least 60%.

In a further aspect, a method of providing lighting includes providing a device including a light emitting assembly having at least one light panel including at least one phosphorescent organic light emitting device, a total light emitting area of the light emitting assembly having an area greater than 1000 cm$^2$, the device exhibiting a luminous emittance of at least 7000 lm/m$^2$ and a peak luminance of less than 5000 cd/m$^2$, the light emitting assembly having a luminaire emissive utilization of at least 60%.

The foregoing is a summary and thus may contain simplifications, generalizations, and omissions of detail; consequently, those skilled in the art will appreciate that the summary is illustrative only and is not intended to be in any way limiting.

For a better understanding of the embodiments, together with other and further features and advantages thereof, reference is made to the following description, taken in conjunction with the accompanying drawings. The scope of the claimed invention will be pointed out in the appended claims.

BRIEF DESCRIPTION OF THE SEVERAL
VIEWS OF THE DRAWINGS

FIG. 4A illustrates a spectrum of a compact fluorescent light (CFL) source.

FIG. 4B illustrates a spectrum of a light emitting diode (LED) light source.

FIG. 4C illustrates a spectrum of an organic light emitting diode (OLED) light source.

FIG. 6A illustrates an embodiment of a light emitting assembly hereof.

FIG. 7 illustrates a perspective view of a light emitting device hereof including a curved or arced light emitting assembly and a projection of the active areas and non-emissive areas of the light emitting assembly upon a plane for the purpose of determining a luminaire emission utilization.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
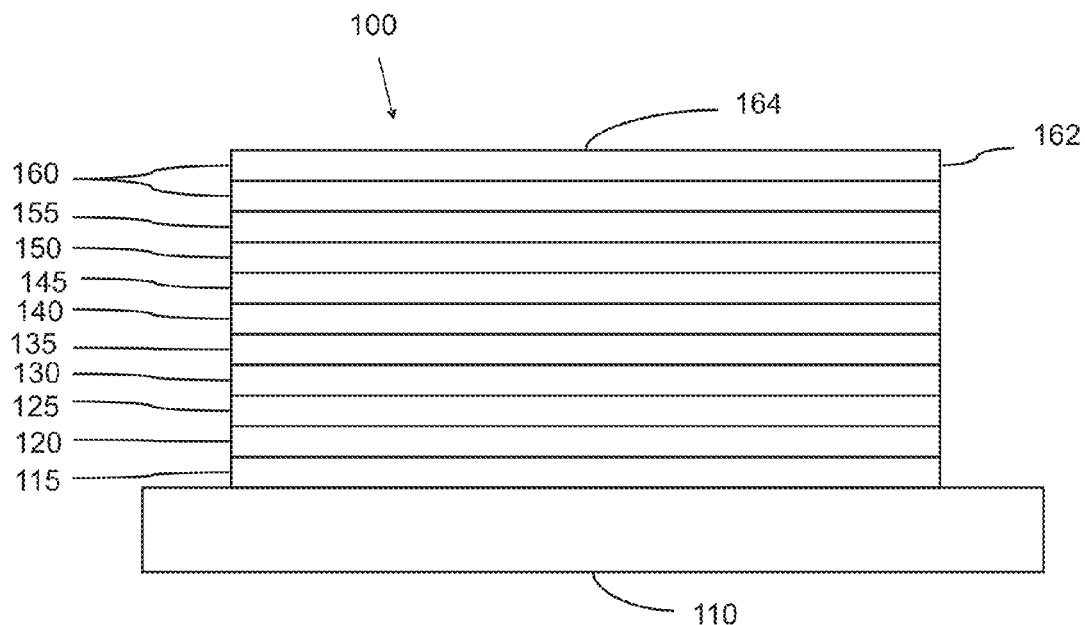
FIG. 1 illustrates schematically an embodiment of organic light emitting device.

FIG. 1 illustrates an embodiment organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
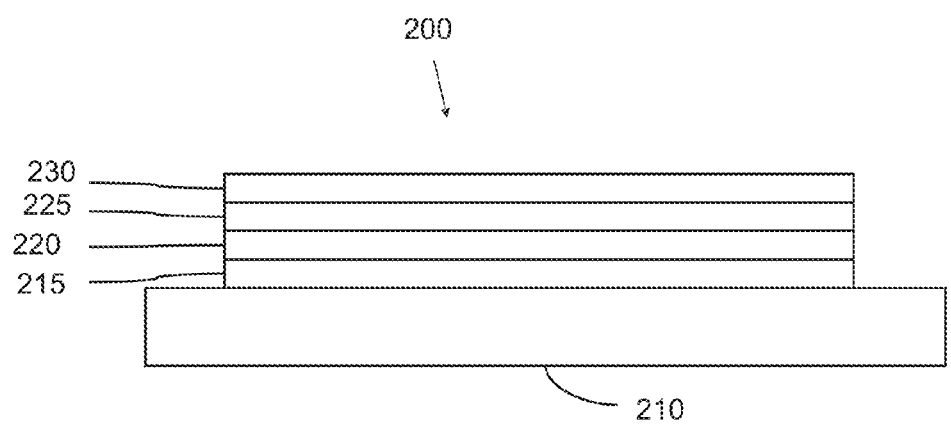
FIG. 2 illustrates schematically an embodiment of an inverted organic light emitting device that does not have a separate electron transport layer.

FIG. 2 illustrates an embodiment of inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments hereof may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although various layers may be described as including a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments hereof may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer.

The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are incorporated herein by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments hereof may be incorporated into a wide variety of consumer products, including flat panel displays, computer monitors, medical monitors, televisions, billboards, lights for interior or exterior illumination and/or signaling, heads up displays, 3-D displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the methods hereof, including passive matrix and active matrix. Many of the devices are intended for use in a temperature range comfortable to humans, such as 18 degrees C. to 30 degrees C., and more preferably at room temperature (20-25 degrees C.), but could be used outside this temperature range (for example, from −40 degrees C. to +80 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

It will be readily understood that the components of the embodiments, as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, et cetera. In other instances, well known structures, materials, or operations are not shown or described in detail to avoid obfuscation.

As used herein and in the appended claims, the singular forms "a," "an", and "the" include plural references unless the context clearly dictates otherwise. Thus, for example, reference to "a light panel" includes a plurality of such light panels and equivalents thereof known to those skilled in the art, and so forth, and reference to "the light panel" is a reference to one or more such light panels and equivalents thereof known to those skilled in the art, and so forth.

A desirable characteristic for a lighting system is to minimize or eliminate glare. Glare may, for example, be referenced as difficulty in viewing an object in the presence of a bright light source, and may be caused by a significant ratio of luminance between the object being viewed and the glare source. The human eye can function from very dark to very bright levels of light. Its sensing capabilities reach across nine orders of magnitude. However, in any given moment of time, the eye can only sense a contrast ratio of approximately 1000. Thus, a high luminance lighting device or luminaire would reduce the ability of human eyes to see certain objects at low luminance. Additionally, glare can cause discomfort, resulting in an instinctive desire to look away from a bright light source (sometimes referred to as discomfort glare). Glare can also cause disability (sometime referred to as disability glare). Furthermore, the spectrum property of the light sources also has an impact on glare. Light at short wavelength causes glare more easily.

Figure 3A:
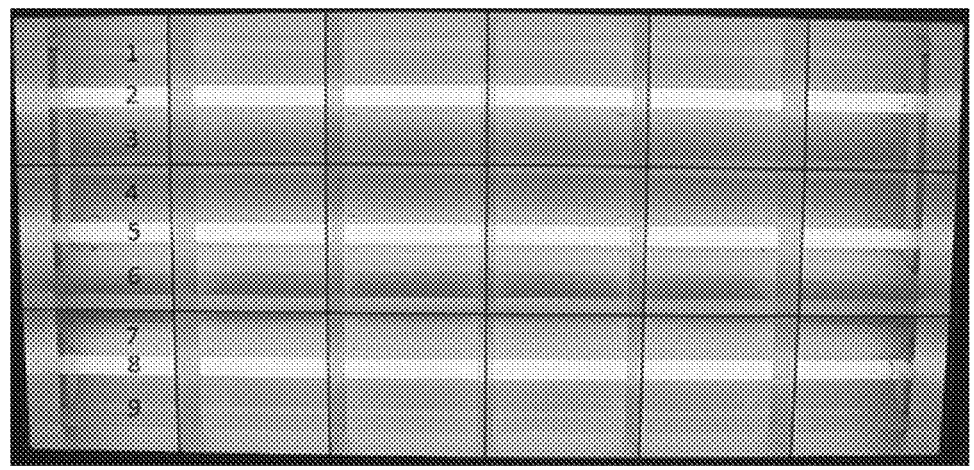
FIG. 3A is a photograph of a fluorescent lighting fixture or troffer exhibiting a relatively high contrast ratio.

Using a fluorescent lighting troffer (that is, the assembly that supports one or more fluorescent lighting devices) as an example, in transitioning from a T-12 fluorescent bulb to a T-8 fluorescent bulb, additional steps must be taken to address glare issues. A primary difference between T-8 and T-12 fluorescent bulbs is the diameter of the bulbs. T-8 bulbs are eight eighths of an inch (or one inch) in diameter, while T-12 bulbs are twelve eighths of an inch (or one and a half inches) in diameter. The smaller T-8 fluorescent bulb appears much brighter than the T-12 fluorescent bulb while generating approximately the same amount of lumens as the T-12 fluorescent bulb. FIG. 3A illustrates a photograph of a commercially available 2'×4' fluorescent light troffer. Table 1 sets forth the luminance of the fluorescent light troffer of FIG. 3A at various positions or points thereon as defined in FIG. 3A.

TABLE 1

| Point | Luminance [cd/m$^2$] |
| --- | --- |
| 1 | 1550 |
| 2 | 8350 |
| 3 | 1110 |
| 4 | 1550 |
| 5 | 8230 |
| 6 | 1620 |
| 7 | 1580 |
| 8 | 7540 |
| 9 | 1630 |

As set forth in Table 1, the luminance level of the fluorescent lighting troffer of FIG. 3A ranges from 1110 to 8350 cd/m$^2$, resulting a contrast ratio of 7.5 ($L_{max}/L_{min}$) and a very high peak luminance of 8350 cd/m$^2$. This high level of luminance may cause visual discomfort and disability glare. Installing shielding/diffuser/louvers etc. may help to partially address this problem (as shown in FIG. 3A). However, glare cannot be eliminated by such design characteristics.

The root cause of glare in most lighting devices, including the fluorescent lighting troffer of FIG. 3A is that the light sources in such lighting devices are "point light sources". In that regard, the light is generated in a relatively small volume (as compared to the total area of the device) with extremely high intensity. Distributing the light poses a huge challenge, often requiring complicated optics which significantly reduce the efficacy of such lighting devices and increase the cost thereof. As a result, existing light devices exhibit a high contrast and a high peak luminance level.

In a number of embodiments hereof, OLED light panels are used in light emitting assemblies hereof to, for example, minimize or eliminate glare. Light emitting assemblies hereof include one or a plurality of OLED light panels. The term "light emitting assembly" is used herein to refer to that portion of light device upon which the one or more OLED light panels of the lighting device are supported. The light emitting assembly includes, for example, the one or more OLED panels, any surrounding bezel(s) and any surrounding frame areas. As used herein, the term "OLED lighting panel" refers to a panel used for general illumination purposes, in contrast, for example, to an OLED display panel. There may be a number differences between OLED lighting panels and display panels. Display panels are used to display images. As a result, smaller devices corresponding to the pixels of the display panel are generally desirable to achieve higher resolutions, and it is also desirable to have pixels with a relatively low aspect ratio so that both vertical and horizontal resolution may be obtained. Also, in a display panel, it is generally desired to independently control the on-off state and intensity of each pixel. In a lighting panel, larger devices are generally desirable to achieve higher fill factors and high total light output, and it may be less desirable in some circumstances to independently control whether different devices are on or off. A lighting panel may be made to have a fixed color, or be color tunable by having pixels of different colors. In a lighting device it may be desirable to control all pixels of the same color to be at the same luminance. Also, for many uses of a lighting panel, a high Color Rendering Index (CRI) is desirable, while CRI is a lesser consideration in a display panel. CRI is generally reported in terms of general CRI, which is usually denoted by Ra. Conversely, achieving specific CIE coordinates is desirable for the different color devices of a full color display, whereas specific CIE coordinates may be lesser consideration for a lighting panel. The color of a white lighting panel is usually defined by its correlated color temperature.

Unlike conventional light sources, an OLED is a planar, diffused light source. We have, for example, achieved a luminance uniformity of 85%, which corresponds to contrast ratio (CR) of 1.18, on a 6 inch by 6 inch OLED light panel. Optimization of panel design to achieve such high uniformity and low contrast ratios is, for example, described in U.S. Patent Application Publication No. 2012/0286298, the disclosure of which is incorporated herein by reference. To reduce or eliminate glare in a number of embodiments hereof, the peak luminance of OLED light panels hereof is less than 5,000 cd/m$^2$. While maintaining a peak luminance of the OLED light panels less than 5,000 cd/m$^2$, the OLED panels hereof may provide a luminous emittance at least 7,000 lm/m$^2$. In a number of embodiments, the OLED panels hereof may provide, for example, up to 10,000-15,000 lm/m$^2$ before they exhibit glare. As used herein, luminous emittance (lm/m$^2$) refers to the total number of lumens emitted by the light emitting assembly divided by the light emitting assembly area, which includes both active emissive area and non-emissive area. The panel area may be smaller than the substrate area, which includes non-emissive areas around the edges of the panel that may be needed for encapsulation, electrical connections, mechanical mounting etc. Virtually all other types of currently available lighting require bulky diffusers etc. to provide luminous emittance of lighting without significant glare. Thus, OLEDs, and particularly organic electronic light emitting devices including organic phosphorescent emitting materials or PHOLEDs, are well-suited for use in a lighting device. As used herein, the terms, "phosphorescent organic electronic light emitting devices" or "PHOLEDs" refer to organic light emitting devices that include organic phosphorescent emitting materials as light sources. In a number of embodiments hereof, it is desirable to have as much of the light as possible generated from phosphorescent emitting materials, particularly for warm white light. In some embodiments, all photons emitted by the OLED(s) are of electronic light emitting device hereof may be emitted by organic phosphorescent emitting materials. In embodiments in which cool white light (typically having a color temperature over 5000 K) is to be emitted by OLED light panels hereof, it may be desirable to use fluorescent blue emitting materials to increase lifetime.

In a number of embodiments, light emitting assemblies hereof are designed to maximize a luminaire emission utilization thereof to facilitate reduction of peak illuminance. As used herein, the term "luminaire emission utilization" refers to the ratio between the maximum projected emissive area or active area of the light emitting assembly and the associated clearance area or total projected area of the light emitting assembly. In the case of relatively large area lighting devices (having a total light emitting area of the light emitting assembly greater than 1000 cm$^2$) the total projected area of the light emitting assembly is often equivalent to the total projected area of the lighting device or total visible area of the lighting device. As used herein, the "active area" of an OLED light panel refers to the emissive area of the panel (that is, the portion of the OLED panel that emits light). The active area of an OLED panel thus generally refers to the area defined within the outline or perimeter of the OLED subpixel pattern thereof, minus any areas within the perimeter not emitting light. As the active areas of the light emitting assemblies hereof arise from the OLED light panel(s) of the light emitting assemblies, the active area of the light emitting assemblies is the total of the active areas of the OLED light panels thereof.

Table 2 sets forth the characteristics for an embodiment of an OLED luminaire hereof. With luminous emittance ranging from 7,000 to 10,000 lm/m$^2$, different combinations of luminaire emissive utilization (quoted when the luminaire is flat) and contrast ratio were designed to control the peak luminance to be lower than 5000 cd/m$^2$. This level of luminance is generally regarded as not causing glare.

TABLE 2

|  | A | B | C | D |
| --- | --- | --- | --- | --- |
| Luminous Emittance (lm/m$^2$) | 7,000 | 10,000 | 10,000 | 10,000 |
| Luminaire Emissive Utilization (at flat configuration) | 60 | 75 | 80 | 90 |
| Contrast Ratio | 1.6 | 1.25 | 1.1 | 1.1 |
| Peak Luminance | 4828 | 4775 | 4178 | 3714 |

Currently available OLED lighting devices or systems cannot provide both high luminous emittance and no (or limited) glare at the same time. In a number of embodiments of an OLED lighting device hereof, a light emitting assembly of the device in which the total area of the light emitting assemblies is greater than 1000 cm² includes at least one light panel including at least one phosphorescent organic light emitting device or PHOLED. In a number of embodiments hereof, the light emitting assemblies exhibit a luminous emittance of at least 7000 lm/m² and a peak luminance of less than 5000 cd/m². Moreover, the light emitting assemblies have a luminaire emissive utilization of at least 60 percent.

Figure 3B:
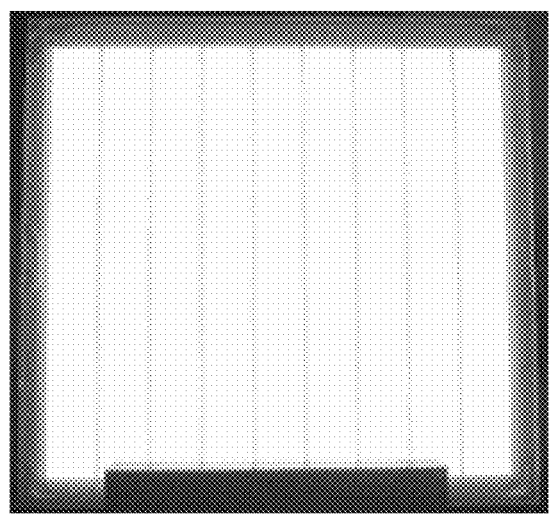
FIG. 3B is a photograph of an organic light emitting device exhibiting a relatively low contrast ratio

For comparison with the fluorescent troffer of FIG. 3A, FIG. 3B illustrates a representative embodiment of a 6" by 6" OLED lighting panel with 75% fill factor (defined as ratio of emissive area over 6" by 6" substrate area) and 90% uniformity (CR=1.1) at a luminance of 3000 cd/m². This performance is achieved by using high efficiency phosphorescent OLED and optimized panel design. When incorporated with bezel-less technologies as disclosed, for example, in U.S. patent application Ser. No. 13/422,924, the disclosure of which is incorporated herein, the width/area of the bezel can be substantially reduced or eliminated. A fill factor of 90% or greater may be achieved. By optimizing panel design, a contrast ratio of 1.1 or less may be achieved. Using such OLED light panels, OLED lighting devices or systems with high luminous emittance with no glare (that is, a peak luminance of less than 5000 cd/m²) may be achieved as demonstrated in Table 2.

Another significant advantage of OLED lighting systems in addressing glare is the light quality of OLEDs. In LED and fluorescent technologies, high energy short wavelength light is critical as it down converted to longer wavelength. However, this high energy light much more easily causes glare to human eyes. In FIGS. 4A through 4C, spectra of CFL, LED and OLED light sources, respectively, are illustrated. It is very clear that LED and CFL light sources have very strong high energy, glare-prone light components. OLED system, however, can be built with very little high energy light (see the encircled regions of FIGS. 4A and 4B). In a number of embodiments, light emitted by the OLED light panels hereof includes no greater than 1% light having a peak wavelength less than 440 nm.

In case of an LED, the chip of the LED is an emissive area. However, the light-guide is not. As described above, OLEDs are planar, diffused light sources, which is significantly different from, for example, LED edge lit luminaires. Moreover, phosphorescent OLED panels have low operating temperature and good thermal uniformity. This is also dramatically different from LED-based systems. The root cause of the relatively high operating temperatures and poor thermal uniformity of LED-based lighting system is the same as the root cause of glare therein: that is, an LED is a point light source. Not only light, but also heat, or power is highly concentrated and needs to be evenly distributed.

Figure 5:
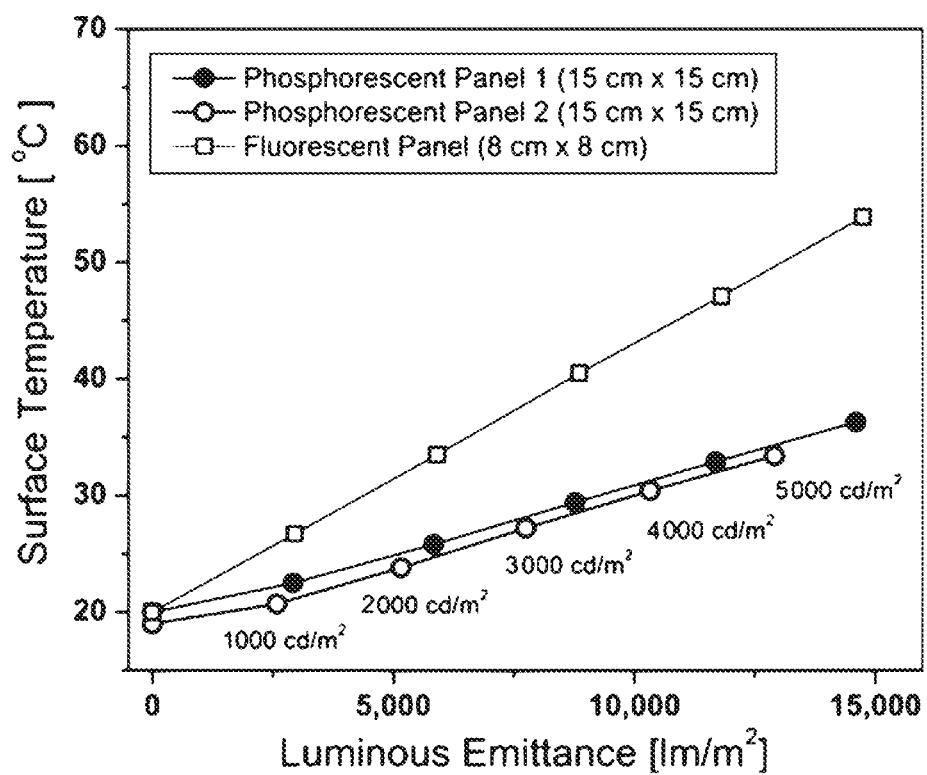
FIG. 5 illustrates a plot of surface temperature versus luminous emittance for two phosphorescent organic electronic light emitting device panels and a fluorescent organic light emitting device panel.

OLEDs, and particularly PHOLEDs, offer significant benefits in thermal management. FIG. 5 illustrates a plot of surface temperature versus luminous emittance for two phosphorescent organic electronic light emitting device panels and a fluorescent organic light emitting device panel driven at various luminance levels. Even at 5000 cd/m², the temperature of the PHOLED panels are less than 35 C. This is dramatically different from LED based system. In a number of embodiments, one or more PHOLED light panels of lighting devices hereof may exhibit a maximum temperature during illumination in ambient conditions (that is, 20 to 25° C.) of no greater than 40° C. or no greater than 35° C. Additionally, OLED light panels hereof may be made to be thermally very uniform. Unlike, for example, LED panels, OLED/PHOLED panels do not have hot LEDs paced around a panel edge. The temperature variance across an area of OLED/PHOLED light panels hereof may, for example, be no greater than +/−5° C.

The low operational temperature and uniform thermal distribution also benefits the device lifetime and prevent differential aging.

Highly efficient OLED light panels including PHOLEDs are, for example, described in PCT International Patent Application Publication No. WO 2011/146734, the disclosure of which is incorporated herein by reference. By using phosphorescent OLED technology with high internal quantum efficiency, heating from non-radiative decay of exciton states can be almost entirely removed. The internal quantum efficiency of all phosphorescent devices may, for example, be at least 70%, at least 90%, and most preferably about 100%. 100% is the top of any range for internal quantum efficiency. The use of high internal quantum efficiency phosphorescent OLEDs enables lower temperatures than for equivalent fluorescent OLED panels (see, for example, FIG. 5), which inherently generate a significant amount of heat as a result of the presence of excitons that cannot emit light, and that decay via other mechanisms that generally involve the generation of heat. Furthermore, lower current required to drive a PHOLED lighting panel reduces $I^2R$ power loss and associated heat generation in distributing current throughout the light emitting panel area.

Phosphorescent OLEDs having internal quantum efficiency as described above are known to the art and may be readily achieved. Examples from the literature include devices disclosed in the following references:

Schwartz, G. et al., Triple Harvesting in Hybrid White Organic Light-Emitting Diodes, Adv. Fun ct. Mater. (2009) 19, 1319-1333.

Reineke, S. et al., White Organic Light-Emitting Diodes with Fluorescent Tube Efficiency, Nature (14 May 2009) 459, 234-239.

Xiao, L. et al., Nearly 100% Internal Quantum Efficiency in an Organic Blue-Light Electrophosphorescent Device Using a Weak Electron Transporting Material with a Wide Energy Gap, Adv. Mater. (2009) 21, 1271-1274.

Williams, Evan et al., Excimer-Based White Phosphorescent Organic Light Emitting Diodes with Nearly 100% Internal Quantum Efficiency, Adv. Mater. (2007) 19, 197-202.

Wang, Q. et al., Harvesting Excitons Via Two Parallel Channels for Efficient White Organic LEDs with Nearly 100% Internal Quantum Efficiency: Fabrication and Emission-Mechanism Analysis, Adv. Funct. Mater. (2009) 19, 84-95.

Jeon, S. et al, Theoretical maximum quantum Efficiency in Red Phosphorescent Organic Light-Emitting Diodes at a Low Doping concentration Using a Spirobenzojluorene Type Triplet Host Material, Organic Electronics (2010) 11, 881-886.

Sun, Y. et al., Management of Singlet and Triplet Excitons for Efficient White Organic Light Emitting Devices, Nature (13 Apr. 2006) 440, 908-912.

Baldo, M. et al., Highly Efficient Phosphorescent Emission From Organic Electroluminescent Devices, Nature (10 Sep. 1998) 395, 151-154.

Sun, Y. et al., Multiple Exciton Generation regions in Phosphorescent White Organic Light Emitting Devices, Organic Electronics (2008) 9, 994-1001.

Jeon, W. et al, Low Roll-Off Efficiency Green Phosphorescent Organic Light-Emitting Devices with Simple Double Emissive Layer Structure, Applied Physics Letters (2008) 93, 063303-1-063303-3.

Many of these references describe a combination of the desired internal quantum efficiency with a device having a desirably high CRI.

FIG. 6A illustrates an embodiment of a light emitting assembly 300 hereof which includes a plurality (eight in the illustrated embodiment) of OLED/PHOLED light panels 310. As clear to those skilled in the art, fewer than eight OLED light panels 310 may be used (including, for example, a single OLED light panel) and greater than eight OLED light panels 310 may be used. OLED light panels typically include a plurality of sub-pixels disposed upon a substrate. Alternatively, OLED light panels may also comprise only one lighting device. OLEDs may, for example, create white light by combining differently colored (for example, red, green, and blue) sub-pixels as known in the art in a side-by-side or stacked arrangement. Single emitting white OLED panels or monochrome colored OLED panels may also be used herein.

Figure 6B:
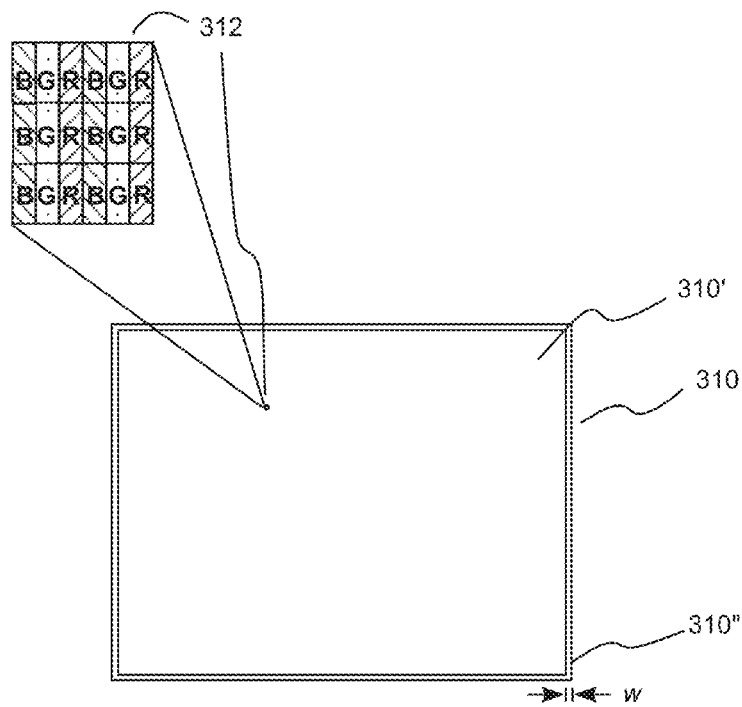
FIG. 6B illustrate an OLED light panel of the light emitting assembly of FIG. 6A.

An individual light panel 310 of light emitting assembly 300 is illustrated in FIG. 6B. A representative example of an area 312 of an OLED light panel 310 is illustrated in FIG. 6B in which a red, green, blue or RGB stripe sub-pixel pattern is formed. Once again, RGB subpixels may alternatively be stacked in a vertical arrangement to form pixels. As known to those skilled in the art, an OLED panel may, for example, include one, tens, hundreds, thousands or more pixels. Associated electronic circuitry may be present to individually drive each sub-pixel, or a group of sub-pixels which emit the same color.

In that regard, driver system 330 (including, for example, one or more drivers) as illustrated in FIG. 6A may be in operative connection with panels 310. Driver system 330 may, for example, be in communicative connection with a processor system 340 (including, for example, one or more microprocessors) and an associated memory system 350 (including, for example, one or more memory devices).

Figure 6C:
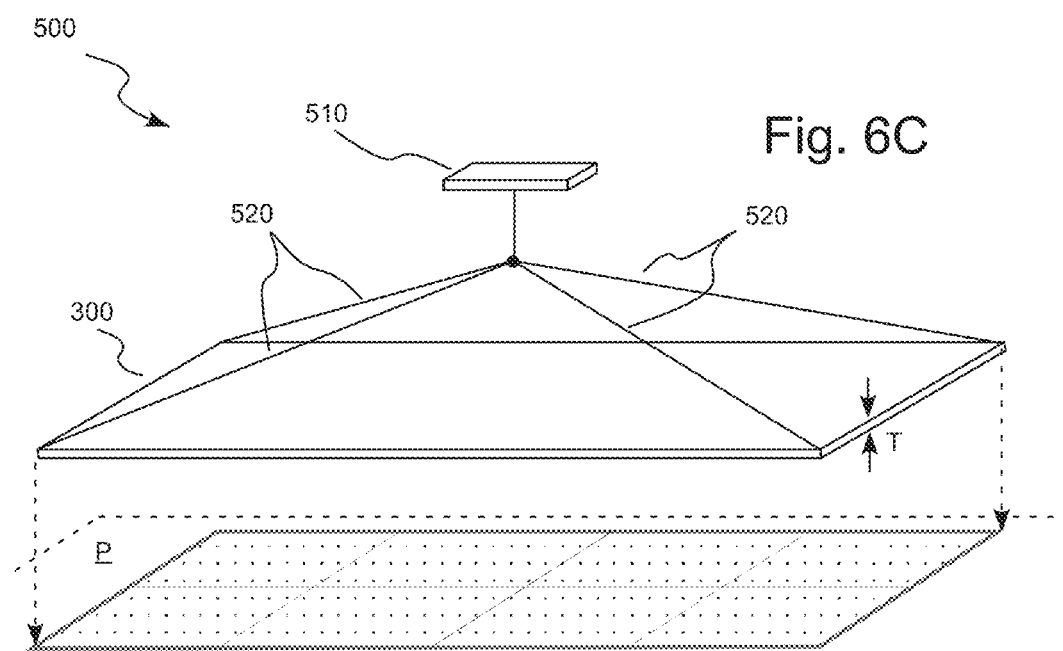
FIG. 6C illustrates a perspective view of a light emitting device hereof including the light emitting assembly of FIG. 6A and a projection of the active areas and non-emissive areas of the light emitting assembly upon a plane for the purpose of determining a luminaire emission utilization.

FIG. 6C illustrates light emitting assembly 300 incorporated within a representative embodiment of a lighting device 500. Lighting device 500 includes a connector mechanism including a support 510 and plurality of suspension lines 520 in operative connection between support 510 and light emitting assembly 300. Support 510 may, for example, be attached to a ceiling. Alternatively, light emitting assembly 300 may be directly attached to a surface such as a ceiling or a wall via connectors as known in the art. Lighting device 500 may, for example, be powered by one or more batteries (which may, for example, be rechargeable) or via an available power grid or power source. Lighting device 500 may also be powered and/or controlled wirelessly. Wireless control system may, for example, be integrated in the driver system 330.

The concept of luminaire emission utilization may, for example, be better understood with reference to FIG. 6C wherein the projected emissive area or active area of light emitting assembly 300 and the total projected area (or clearance area) of the light emitting assembly on a plane P is illustrated. The orientation of the light emitting assembly 300 relative to plane P is chosen such that the projected active area is maximized. In the case of a planar OLED light panels 310, the projected active area is maximized when light emitting assembly 300 and light panels 310 thereof are oriented parallel to plane P. The surface areas of each of the active areas and non-active or non-emissive areas are projected as if a columnar source of light was emanating therefrom in a direction orthogonal to the plane (see dashed arrows in FIG. 6C). The areas that reduce luminaire emission utilization include non-emissive areas such as bezels, packaging areas, non-emissive panel areas, frame areas and so on. Projected non-emissive areas are illustrated with dark lines and dots in FIG. 6C, which may be exaggerated for visualization. As set forth above, the luminaire emission utilization is calculated by dividing the projected active area by the total projected area of light emitting assembly 300.

Because OLED panels 310 may, for example, be formed on a flexible substrate as described above, light emitting assemblies are readily formed in virtually any arced, curved or curvilinear profiles. FIG. 7, for example, illustrates a light emitting device 500*a* including a curved or arced light emitting assembly 300*a* including two curved or arced OLED light panels 310*a*. In general, light emitting device 500*a* is similar in construction and operation to light emitting device 500 and components thereof are numbered similarly to like components of light emitting device 500 with the addition of the designation "a" thereto. Moreover, light emitting assembly 300*a* may be flexible so that the user may change the conformation thereof. Additionally, OLED light panels 310 or 310*a* may be transparent so that at least a portion of light emitting assembly 300 or light emitting assembly 300*a*, respectively may be transparent at off state.

FIG. 7 also illustrates the projected emissive area or active area of light emitting assembly 300*a* and the total projected area of light emitting assembly 300*a* on a plane P for the purpose of determining the luminaire emissive utilization. The orientation of the light emitting assembly 300 relative to plane P is once again chosen such that the projected active area is maximized.

A number of design parameters may, for example, be optimized to maximize luminaire emission utilization. For example, OLED light panels 310 may be designed to have a relatively high percentage of emissive areas or active areas. In that regard, light emitting panels 310 or 310*a* may be fabricated to have a high fill factor (FF), which assists in reducing the peak luminance. The term "fill factor" as used herein refers to the ratio between the emissive surface area or active area of the OLED panel and the total surface area of the light emitting panel.

Various design approaches and optimization techniques may, for example, be used to maximize the fill factor. Some of the approaches may include, but are not limited to: optimizing panel layout design where narrower and/or less non-emissive metal bus lines are integrated; reducing border and bezel regions on the panel by applying thin film encapsulation; employing novel device structure where emissive bus lines are incorporated; engineering and/or matching sheet resistances of electrodes such that bus lines may be completely eliminated; increasing the thickness of bus lines while reducing the width of bus lines; using highly conductive metal, such as silver or copper, as bus lines; minimizing the coverage of insulator over metal bus lines; using stacked OLED structure to reduce current density and therefore to reduce the amount of bus lines; applying external wires outside active area to assist current distribution without impacting fill factor; and the combination of thereupon. Such techniques are, for example, discussed in U.S. Patent Application Publication No. 2012/0286298, U.S. patent application Ser. No. 13/422,924; filed Mar. 16, 2012, U.S. patent application Ser. No. 13/547,985; filed Jul. 12, 2012, U.S. Patent Application Publication No. 2012/0286651 and U.S. patent application Ser. No. 13/173,072, the disclosures of which are incorporated herein by reference.

OLED light panels may, for example, have borders of limited width or be "borderless" OLED light panels wherein there is little to virtually no gap between a substrate edge and the OLED active area. Borderless OLED displays are, for example, described in U.S. patent application Ser. Nos. 13/422,924 and 13/547,985, and U.S. Pat. Nos. 7,304,634, 6,885,157, 7,814,652 and 6,620,731 As used herein, the terms "border", "inactive border area", "inactive edge area" or like terms refer to area around the active area of the OLED panel that is not emissive (that is, the portion of the OLED panel around the active area from which no light is emitted).

"Borderless" OLED light panels are facilitate by encapsulation with such thin-film barrier layer encapsulation. As used herein, a "barrier film" or "barrier layer" refers to a layer of material that may be utilized to decrease the permeation of gases, vapors, and/or moisture (or other environmental particulates) into the active device area of the device so as to increase lifetime and/or reduce performance degradation. As describe above, in a number of embodiments, the barrier film may comprise a hybrid layer comprising a mixture of a polymeric material and a non-polymeric material. As used herein, the term "non-polymeric" refers to a material made of molecules having a well-defined chemical formula with a single, well-defined molecular weight. A "non-polymeric" molecule can have a significantly large molecular weight. In some circumstances, a non-polymeric molecule may include repeat units. As used herein, the term "polymeric" refers to a material made of molecules that have repeating subunits that are covalently linked, and that has a molecular weight that may vary from molecule to molecule because the polymerizing reaction may result in different numbers of repeat units for each molecule. For example, in some embodiments, the barrier film may comprise a mixture of polymeric silicon and inorganic silicon. Examples of barrier films are described in more detail in U.S. Pat. No. 7,968,146 and PCT Patent Application Nos. PCT/US2007/023098 and PCT/US2009/042829.

As described above, a preferred barrier layer includes a mixture of a polymeric material and a non-polymeric material. In a number of embodiments, a barrier film is deposited in a thin film deposition technique such as vapor deposition using an organosilicon precursor. The barrier film may, for example, consist essentially of a mixture of polymeric silicon and inorganic silicon. In a number of embodiments, the weight ratio of polymeric silicon to inorganic silicon may be in the range of 95:5 to 5:95. The polymeric silicon and the inorganic silicon may, for example, be created from the same precursor material. In a number of embodiments, at least a 0.1 μm thickness of the barrier film may be deposited under the same reaction conditions for all the reaction conditions in the deposition process. In a number of embodiments, the water vapor transmission rate provided by the barrier film may be less than $10^{-6}$ g/m$^2$/day through the at least 0.1 μm thickness of the barrier film.

In a number of embodiments hereof, the maximum width of any inactive edge area or inactive border area (see, for example, width w of inactive border area 310" surrounding active area 310' in FIG. 6B) of an OLED panel may, for example, be no more than 3 mm, no more than 2 mm, no more than 1 mm, or even no more than 0.1 mm. Although the outline or perimeter of active area 310' (see FIG. 6B) of OLED panel 310 is rectangular in shape, the active areas may, for example, be irregular, curved or curvilinear in shape. Regardless of the shape of the active area, the specifications for the maximum width of any associated inactive border area are applicable.

As known in the art, a bezel 320 may be used to surround the light emitting OLED panel or panels 310 of light emitting assembly 300. OLED-based light emitting assemblies 300 are well-suited to having narrow bezels, so that the light emitting or active area (as defined by panel(s) 310) can be positioned very close to the edge of light emitting assembly 300. Bezel 320 may, for example, have a width W of no greater than 5 mm or no greater than 3 mm.

In a number of embodiments hereof, the maximum width of any inactive edge area or inactive border area (see, for example, width w of inactive border area 310" surrounding active area 310a in FIG. 6B) of an OLED panel may, for example, be no more than 3 mm, no more than 2 mm, no more than 1 mm, or even no more than 0.1 mm. Although the representative active area 310' (see FIG. 6B) of OLED panel 310 is rectangular in shape, the active areas may, for example, be irregular, curved or curvilinear in shape. Regardless of the shape of the active area, the specifications for the maximum width of any associated inactive border area are applicable.

As known in the art, a bezel 320 may be used to surround the light emitting OLED panel or panels 310 of light emitting assembly 300. OLED-based light emitting assemblies 300 are well-suited to having narrow bezels, so that the light emitting or active area (as defined by panel(s) 310) can be positioned very close to the edge of light emitting assembly 300. Bezel 320 may, for example, have a width W of no greater than 5 mm, no greater than 3 mm, no greater than 1 mm or no greater than 0.1 mm.

As described above, in a number of embodiments hereof, the total active area of the light emitting panel(s) of the lighting devices hereof is at least 1000 cm$^2$. However, smaller as well as larger light emitting portions are readily provided. Light emitting assemblies for device hereof may also be relatively thin. In a number of embodiments, the light emitting portion of devices hereof (sometimes referred to herein as a light emitting assembly) have a maximum depth or thickness of no greater than 5 mm (see, for example, dimension T in FIG. 6C and FIG. 7).

Control may, for example, be provided to tune color or color temperature (for example, on the spectrum warm to cool white light). Control may also be provided to control dimming (that is, to increase or decrease the total light output from light emitting assemblies hereof).

As described above, each OLED light panel may include at least two groups of OLED elements that emit light with different peak wavelengths. Each OLED element may, for example, include an OLED, Each OLED element may also, for example, includes fault tolerant structure as, for example, described in U.S. Patent Application Publication No. 2012-0181933 and U.S. patent application Ser. No. 13/590,081, the disclosures of which are incorporated herein by reference. The lighting device may, for example, include a single driver that electrically splits into at least two sub-drivers to operate each group of OLED elements emitting light of different peak wavelengths. Alternatively, the lighting system may include at least two individual drivers to operate each group. The OLED elements from one group may, for example, all be connected in parallel and operated by one driver, or one sub-driver. Each group is driven separately, controlled by its own driver, or sub-driver to control the color or color temperature of light emitted by the OLED light panels hereof.

This disclosure has been presented for purposes of illustration and description but is not intended to be exhaustive or limiting. Many modifications and variations will be apparent to those of ordinary skill in the art. The example embodiments were chosen and described in order to explain principles and practical application, and to enable others of ordinary skill in the art to understand the disclosure for various embodiments with various modifications as are suited to the particular use contemplated.

Thus, although illustrative example embodiments have been described herein with reference to the accompanying figures, it is to be understood that this description is not limiting and that various other changes and modifications may be affected therein by one skilled in the art without departing from the scope or spirit of the disclosure.

What is claimed is:

1. A device, comprising:
a light emitting assembly comprising at least one light panel comprising at least one phosphorescent organic light emitting device, a total light emitting area of the light emitting assembly having an area greater than 1000 cm$^2$, the device exhibiting a luminous emittance of at least 7000 lm/m$^2$ and a peak luminance of less than 5000 cd/m$^2$, the light emitting assembly having a luminaire emissive utilization of at least 60 percent.

2. The device of claim 1 wherein light emitted by the at least one light panel includes no greater than 1% light having a peak wavelength less than 440 nm.

3. The device of claim 1 wherein the device exhibiting a luminous emittance of at least 10000 lm/m$^2$ and a peak luminance of less than 5000 cd/m$^2$.

4. The device of claim 1 wherein a maximum temperature of the at least one light panel during illumination in ambient conditions is no greater than 40° C.

5. The device of claim 1 wherein a maximum temperature of the at least one light panel during illumination in ambient conditions is no greater than 35° C.

6. The device of claim 1 wherein a temperature variance across an area of the at least one light panel is no greater than +/−5° C.

7. The device of claim 1 wherein the light emitting assembly further comprises a bezel encompassing the at least one light panel, wherein the bezel is no greater than 5 mm in width.

8. The device of claim 1 wherein the light emitting assembly further comprises a bezel encompassing the at least one light panel, wherein the bezel is no greater than 3 mm in width.

9. The device of claim 1 wherein the light emitting assembly further comprises a bezel encompassing the at least one light panel, wherein the bezel is no greater than 1 mm in width.

10. The device of claim 1 wherein the light emitting assembly further comprises a bezel encompassing the at least one light panel, wherein the bezel is no greater than 0.1 mm in width.

11. The device of claim 1 wherein the at least one light panel comprises a plurality of phosphorescent organic light emitting devices and a color temperature of the at least one light panel is adjustable.

12. The device of claim 1 wherein a contrast ratio of the light emitting assembly is no greater than 1.6.

13. The device of claim 1 wherein a contrast ratio of the light emitting assembly is no greater than 1.3.

14. The device of claim 1 wherein a contrast ratio of the light emitting assembly is no greater than 1.1.

15. The device of claim 1 wherein the luminaire emissive utilization of the light emitting assembly is at least 70%.

16. The device of claim 1 wherein the luminaire emissive utilization of the light emitting assembly is at least 80%.

17. The device of claim 1 wherein the luminaire emissive utilization of the light emitting assembly is at least 90%.

18. The device of claim 1 wherein the at least one light emitting panel is flexible.

19. The device of claim 1 wherein the at least one light emitting panel is transparent.

20. The device of claim 1 wherein the at least one light panel comprises a plurality of phosphorescent organic light emitting devices and the light emitting assembly is color tunable.

21. The device of claim 1 wherein the at least one light panel comprises a plurality of organic light emitting devices emitting red light, a plurality of organic light emitting devices emitting green light and a plurality of organic light emitting devices emitting blue light, wherein at least the plurality of organic light emitting devices emitting red light and the plurality of organic light emitting devices emitting green light are phosphorescent organic light emitting devices 22. The device of claim 21 wherein the plurality of organic light emitting devices emitting blue light are phosphorescent organic light emitting devices.

23. A method of fabricating a device comprising a light emitting assembly, comprising:
forming at least one light panel comprising at least one phosphorescent organic light emitting device disposed upon a substrate such that a total light emitting area of the light emitting assembly has an area greater than 1000 cm$^2$, the device exhibiting a luminous emittance of at least 7000 lm/m$^2$ and a peak luminance of less than 5000 cd/m$^2$, and
assembling the at least one light panel into the light emitting assembly, wherein a luminaire emissive utilization of the light emitting assembly is at least 60%.

24. A method of providing lighting, comprising:
providing a device comprising a light emitting assembly comprising at least one light panel comprising at least one phosphorescent organic light emitting device, a total light emitting area of the light emitting assembly having an area greater than 1000 cm$^2$, the device exhibiting a luminous emittance of at least 7000 lm/m$^2$ and a peak luminance of less than 5000 cd/m$^2$, the light emitting assembly having a luminaire emissive utilization of at least 60%.

* * * * *